United States Patent
Friedlund et al.

(10) Patent No.: US 10,291,145 B2
(45) Date of Patent: May 14, 2019

(54) INVERTER ASSEMBLY FOR ELECTRIC POWER SYSTEM

(71) Applicant: Caterpillar Inc., Peoria, IL (US)

(72) Inventors: Jason E. Friedlund, Metamora, IL (US); Todd G. Nakanishi, Brimfield, IL (US)

(73) Assignee: Caterpillar Inc., Deerfield, IL (US)

( * ) Notice: Subject to any disclaimer, the term of this patent is extended or adjusted under 35 U.S.C. 154(b) by 0 days.

(21) Appl. No.: 15/378,096

(22) Filed: Dec. 14, 2016

(65) Prior Publication Data

US 2018/0166995 A1   Jun. 14, 2018

(51) Int. Cl.
| | | |
|---|---|---|
| H02M 7/00 | (2006.01) | |
| H05K 5/00 | (2006.01) | |
| H05K 5/02 | (2006.01) | |
| H02M 7/5387 | (2007.01) | |
| H02P 27/06 | (2006.01) | |
| H02K 11/33 | (2016.01) | |

(52) U.S. Cl.
CPC .......... *H02M 7/003* (2013.01); *H05K 5/0021* (2013.01); *H05K 5/0247* (2013.01); *H02K 11/33* (2016.01); *H02P 27/06* (2013.01)

(58) Field of Classification Search
CPC ...... H02M 7/003; H02M 7/00; H02M 7/5387; H05K 2201/10272; H01R 23/6866
See application file for complete search history.

(56) References Cited

U.S. PATENT DOCUMENTS

| | | | | |
|---|---|---|---|---|
| 5,245,527 A | * | 9/1993 | Duff | H05K 7/1432 361/610 |
| 5,623,399 A | * | 4/1997 | Ishii | H02M 7/003 363/132 |
| 5,872,711 A | * | 2/1999 | Janko | F28F 13/00 174/72 B |
| 5,982,652 A | * | 11/1999 | Simonelli | H02J 9/062 307/26 |
| 6,160,696 A | * | 12/2000 | Bailey | H02M 7/003 361/100 |
| 6,885,553 B2 | * | 4/2005 | Pfeifer | F28F 3/12 257/E23.098 |
| 2013/0271941 A1 | * | 10/2013 | Guan | H05K 7/18 361/811 |

(Continued)

FOREIGN PATENT DOCUMENTS

| | | |
|---|---|---|
| CN | 202076940 | 12/2011 |
| CN | 102723878 | 10/2012 |

(Continued)

*Primary Examiner* — Gary L Laxton
(74) *Attorney, Agent, or Firm* — Calfee, Halter & Griswold LLP

(57) ABSTRACT

An inverter assembly for a power system is provided. The inverter assembly includes a plurality of stackable housing members and a plurality of inverter units received within the plurality of stackable housing members. Each of the plurality of inverter units includes a filter capacitor having a plurality of auxiliary connectors extending outwardly. The inverter assembly also includes a bus bar configured to be connected to the plurality of auxiliary connectors of the filter capacitor of each of the plurality of inverter units to establish electrical connection among the plurality of inverter units.

20 Claims, 5 Drawing Sheets

(56) References Cited

U.S. PATENT DOCUMENTS

| | | | |
|---|---|---|---|
| 2014/0286064 A1* | 9/2014 | Kamizuma | H01G 4/258 |
| | | | 363/123 |
| 2014/0361613 A1 | 12/2014 | Huang et al. | |
| 2015/0061423 A1 | 3/2015 | Nagao et al. | |
| 2015/0145462 A1 | 5/2015 | Ulrich et al. | |
| 2016/0081202 A1* | 3/2016 | Hetzel | H05K 7/20672 |
| | | | 361/724 |
| 2016/0172997 A1 | 6/2016 | Andris et al. | |

FOREIGN PATENT DOCUMENTS

| | | |
|---|---|---|
| JP | 4550307 | 9/2010 |
| KR | 20030004149 | 1/2003 |
| KR | 20070120237 | 12/2007 |

\* cited by examiner

INVERTER ASSEMBLY FOR ELECTRIC POWER SYSTEM

TECHNICAL FIELD

The present disclosure relates to electric power systems, and more particularly to an inverter assembly for an electric power system.

BACKGROUND

Electric power systems are widely used in electrically powered machines to provide power for propulsion and other operations. Typically, an electric power system includes a generator coupled to an engine to convert mechanical power to electrical power. The electric power system also includes multiple inverter units individually connected to the generator for converting an Alternating Current (AC) input from the generator into a Direct Current (DC) internal to a capacitor bank and back to an Alternating Current (AC) output for use by the components of the machine, for example machine propelling motors. Further, the electric power system may be configured to provide a DC input or output for use by the components of the machine. The inverter units may be interconnected to each other such that two or more of the inverter units may collectively supply the AC or DC output to one or more such components of the machine.

In some applications, the inverter units are placed at distant locations on the machine, and are electrically connected to each other using connection cables. Due to high impedance of the connection cables, the inverter units are susceptible to electric resonance, which may lead to increase in power losses. The placement of the inverter units at the distant locations is also undesirable for a variety of other reasons, such as lack of space on the machine and high servicing and/or maintenance time.

U.S. patent application publication number 2014/0361613 (the '613 publication) discloses a system configured to reduce the amplitude of reactive current present on a DC bus shared by multiple inverters. The start of the switching period for the modulation routines of each inverter is synchronized, and a carrier phase angle is determined for a carrier signal within each of the inverters. The modulation routine of each inverter generates a reactive current on the shared DC bus. By controlling the carrier phase angle for each inverter, the reactive current of a first inverter may be generated at a phase angle that is offset from the phase angle of the reactive current generated by a second inverter. As a result, the reactive current from the first inverter cancels at least a portion of the reactive current from the second inverter, reducing the total reactive current present on the DC bus. Notwithstanding the above, the multiple inverters of the '613 publication may be susceptible to electric resonance when placed in a single housing.

SUMMARY OF THE DISCLOSURE

In one aspect of the present disclosure, an inverter assembly for a power system is provided. The inverter assembly includes a plurality of stackable housing members and a plurality of inverter units received within the plurality of stackable housing members. Each of the plurality of inverter units includes a filter capacitor having a plurality of auxiliary connectors extending outwardly. The inverter assembly also includes a bus bar configured to be connected to the plurality of auxiliary connectors of the filter capacitors of each of the plurality of inverter units to establish electrical connection between the plurality of inverter units.

In another aspect of the present disclosure, a power system is provided. The power system includes a power source and an inverter assembly connected to the power source to receive one of an Alternating Current (AC) input and a Direct Current (DC) input. The inverter assembly includes a plurality of stackable housing members and a plurality of inverter units received within the plurality of stackable housing members. Each of the plurality of inverter units includes a filter capacitor having a plurality of auxiliary connectors extending outwardly. The housing member also includes a bus bar configured to be connected to the filter capacitor to establish electrical connection between the plurality of inverter units.

In yet another aspect of the present disclosure, a bus bar for electrically coupling a plurality of inverter units of an inverter assembly is provided. The bus bar includes a first electrode plate configured to be coupled to one or more first auxiliary connectors of a plurality of auxiliary connectors of a filter capacitor of each of the plurality of inverter units. The bus bar also includes a second electrode plate electrically insulated from the first electrode plate. The second electrode plate is configured to be coupled to one or more second auxiliary connectors of the plurality of auxiliary connectors of the filter capacitor of each of the plurality of inverter units.

Other features and aspects of this disclosure will be apparent from the following description and the accompanying drawings.

DETAILED DESCRIPTION

Reference will now be made in detail to specific embodiments or features, examples of which are illustrated in the accompanying drawings. Wherever possible, corresponding or similar reference numbers will be used throughout the drawings to refer to the same or corresponding parts.

Figure 1:
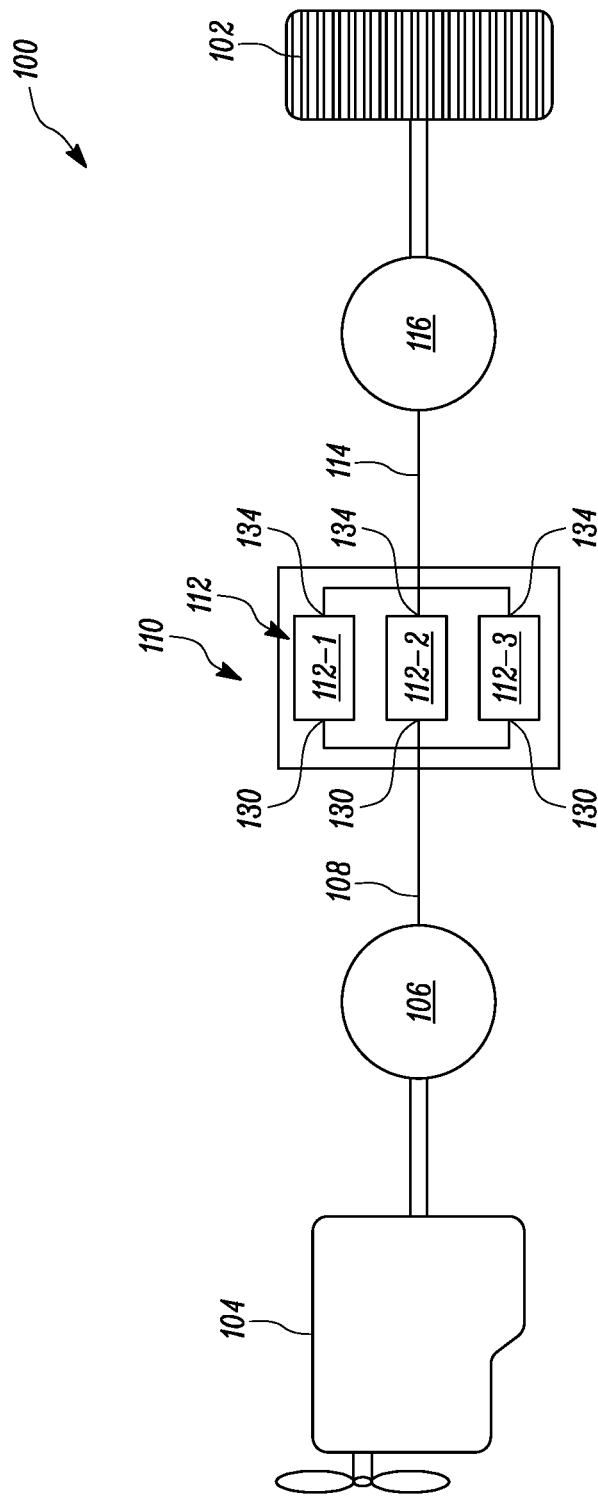
FIG. 1 is a block diagram of a power system having an inverter assembly, according to an embodiment of the present disclosure.

FIG. 1 illustrates a block diagram of a power system 100, according to an embodiment of the present disclosure. In some embodiments, as shown in FIG. 1, the power system 100 is embodied as an electric drive system for propelling a machine (not shown). Alternatively, the power system 100 may be any other electric power supply system used with, lighting systems, implement systems and/or actuating systems, of the machine. The machine utilizing the power system 100 may be a vehicle employed in various operations such as mining operations, construction operations, farming operations, transportation operations, forestry operations, material handling operations, and/or any other industrial operations. The power system 100 may be supported on a frame (not shown) of the machine, and may be configured to drive ground engaging members 102 of the machine, for propelling the machine. The ground engaging members 102 may include one or more track assemblies, a plurality of wheels, and/or a combination of track assemblies and wheels.

Referring again to FIG. 1, the power system 100 may include a power source 104 configured to produce an Alternating Current (AC) output. In some embodiments, the power source 104 may be any internal combustion engine configured to produce a mechanical power output that may be provided to a generator 106. Further, the generator 106 may be configured to produce the Alternating Current (AC) output in response to the mechanical power output or demand from the electrical systems or devices. In some embodiments, the power source 104 may be one of a diesel engine, a gasoline engine, a gaseous fuel powered engine, a turbine engine, and/or the like and may be configured to generate a rotational mechanical output. In this regard, the generator 106 may be one of a three phase alternating field-type generator, a switched reluctance generator, and a direct phase generator configured to produce the AC output in response to a rotational mechanical input from the power source 104.

Although the power source 104 is shown as a combustion engine in FIG. 1, the power source 104 may alternatively be a non-combustion source of power, such as a fuel cell, a battery, or the like, which may be configured to produce, store, and provide the AC output, with or without requiring the generator 106.

Still referring to FIG. 1, the power system 100 may further include an inverter assembly 110 electrically connected to the generator 106 through a first link 108. As illustrated in FIG. 1, and discussed in more detail with respect to FIGS. 2 to 5, the inverter assembly 110 may include a plurality of inverter units 112, individually referred to as a first inverter unit 112-1, a second inverter unit 112-2, and a third inverter unit 112-3. Each of the first inverter unit 112-1, the second inverter unit 112-2, and the third inverter unit 112-3 may be configured to convert the AC input into the DC output. Specifically, each of the first inverter unit 112-1, the second inverter unit 112-2, and the third inverter unit 112-3 may be configured to convert DC output received from any other inverter unit to an Alternating Current (AC) output or the AC output of any electrical motor or generator to a DC output for any other inverter unit 112. From the inverter units 112 of the inverter assembly 110, the AC and/or DC output may be transmitted to various electric systems and/or devices of the machine (such as an implement system, a working tool, a welding tool, a lighting system, and an implement actuating system), through a second link 114, for use by the electric systems and/or devices of the machine.

In some embodiments, the power system 100 may include at least one electric motor 116 electrically connected to the second link 114 for receiving the DC output from one or more of the inverter units 112. The electric motor 116 may be configured to drive the ground engaging members 102 based on the DC output received through the second link 114. In some embodiments, the electric motor 116 may be a permanent magnet alternating field type motor. Additionally, or alternatively, the electric motor 116 may be a switched electric motor, a direct phase motor, or any other type of motor. In some embodiments, to drive the ground engaging members 102 based on operational demands of the machine, the electric motor 116 may also be configured to receive variable frequency DC output from one or more of the inverter units 112 to provide variable power to the ground engaging members 102. Specifically, the inverter units 112 of the inverter assembly 110 may also be configured to vary a frequency of the DC output based on operational demands of various electrical systems and/or devices of the machine.

The components of the power system 100 are shown in FIG. 1 for explanatory purposes. In practice, there may be additional components, fewer components, different components, or differently arranged components than those shown to be connected to the inverter assembly 110 of the power system 100 in FIG. 1. For example, although not shown in FIG. 1, the inverter units 112 may additionally or alternatively be connected to other electric systems or devices of the machine, for example a lighting system, a power tool, a welding implement, and an implement actuating system, for supplying the AC or DC output, and/or a power regeneration unit of the machine, for converting the AC output generated during power regeneration.

Figure 2:
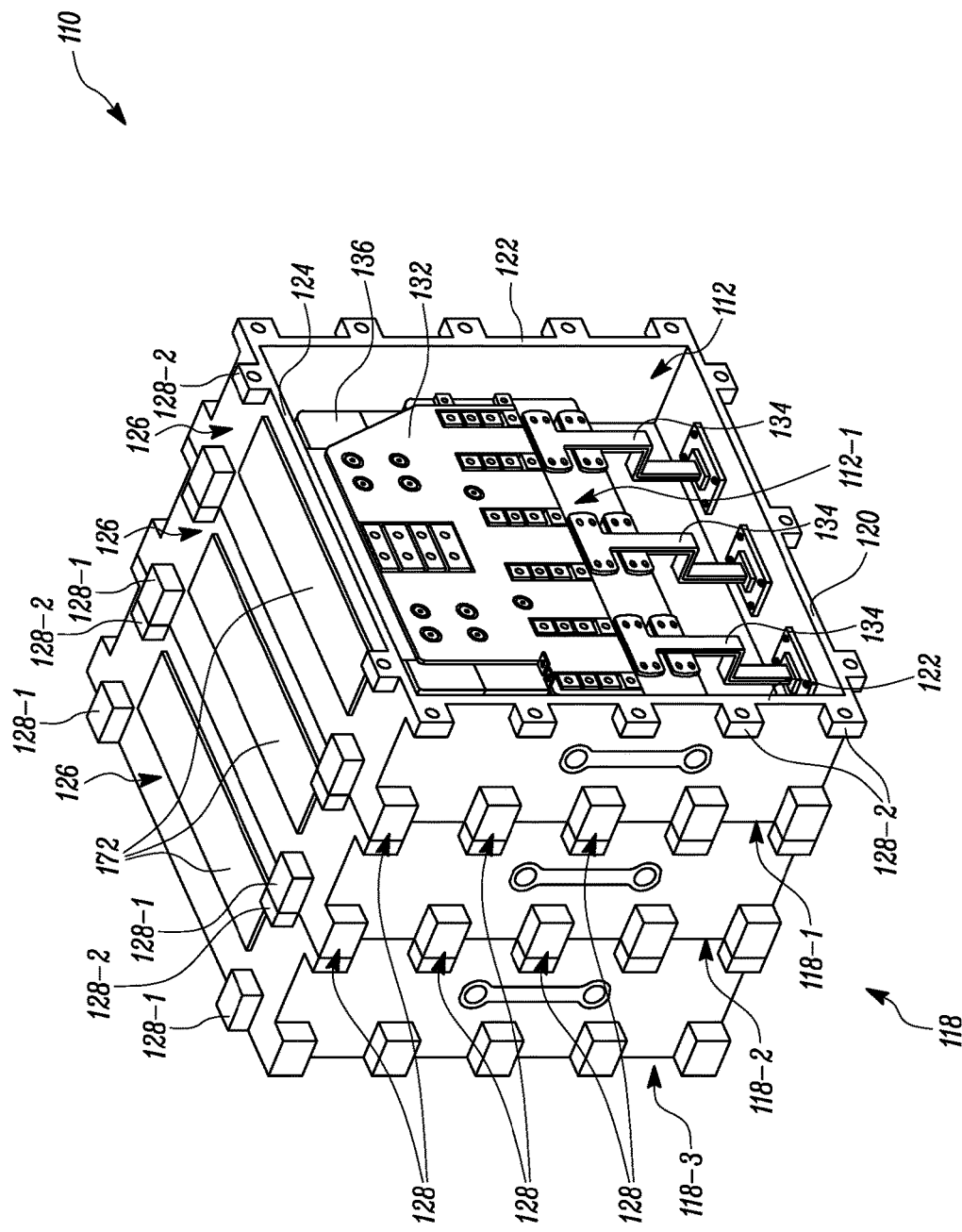
FIG. 2 is a perspective view of the inverter assembly, according to an embodiment of the present disclosure.

FIG. 2 illustrates a perspective view of the inverter assembly 110 of the power system 100, according to an embodiment of the present disclosure. The inverter assembly 110 may include a plurality of stackable housing members 118. As mentioned earlier, the inverter assembly 110 may also include the plurality of inverter units 112 configured to convert the AC input into the DC output. The plurality of inverter units 112 may be received within the plurality of stackable housing members 118.

In some embodiments, the inverter assembly 110, as shown, may include three stackable housing members 118, individually referred to as a first stackable housing member 118-1, a second stackable housing member 118-2, and a third stackable housing member 118-3. In some embodiments, the first stackable housing member 118-1, the second stackable housing member 118-2, and the third stackable housing member 118-3 may be disposed and secured longitudinally adjacent to each other such that a single structure may be formed. The inverter assembly 110 may also include three inverter units 112, such as the first inverter unit 112-1, the second inverter unit 112-2 (shown in FIG. 1), and the third inverter unit 112-3 (shown in FIG. 1), individually received in the first stackable housing member 118-1, the second stackable housing member 118-2, and the third stackable housing member 118-3, respectively. Alternatively, the inverter assembly 110 may include only two stackable housing members, such as the first stackable housing member 118-1 and the second stackable housing member 118-2 and two inverter units, such as the first inverter unit 112-1 and the second inverter unit 112-2. Alternatively, the inverter assembly 110 may include more than three stackable housing members and more than three inverter units.

In some embodiments, the first stackable housing member 118-1, the second stackable housing member 118-2, and the third stackable housing member 118-3 may be configured to separately receive the first inverter unit 112-1, the second inverter unit 112-2, and the third inverter unit 112-3, respectively. Each of the plurality of stackable housing members 118 may include a base plate 120, a pair of side plates 122 extending from the base plate 120, and a top plate 124 disposed on the pair of side plates 122. In some embodiments, for each of the plurality of stackable housing members 118, the base plate 120, the pair of side plates 122, and the top plate 124 may be made of electrically insulating materials. Further, the base plate 120, the pair of side plates 122, and the top plate 124 may form a cuboidal shaped cavity for receiving the respective inverter unit 112.

Furthermore, the plurality of inverter units 112 may be removably or fixedly supported within the cuboidal shaped cavity of the respective stackable housing member 118 such that one inverter unit 112 and the respective stackable housing member 118 may form an integrated modular unit of the inverter assembly 110. In some embodiments, such two or more integrated modular units may be coupled together to form the inverter assembly 110.

In some embodiments, the inverter assembly 110 may also include a plurality of cover members 126 configured to cover the stackable housing members 118 and stack the stackable housing members 118. The plurality of cover members 126 may include multiple connecting blocks 128 that may be coupled to each other by using various coupling means, such as fasteners (e.g., clamps, bolts, openings in respective base plate 120, respective pair of side plates 122, and respective top plate 124) and/or welding. In some embodiments, the connecting blocks 128 may be provided in multiple pairs of a first connecting block 128-1 and a second connecting block 128-2, where the first connecting block 128-1 of a cover member 126 may be configured to engage with the second connecting block 128-2 of another cover member 126. In other words, to stack the stackable housing members 118, such multiple first connecting blocks 128-1 are aligned with respective second connecting blocks 128-2 and thereafter, secured through fasteners.

Referring now to FIGS. 1 and 2, each of the inverter units 112 includes an input terminal 130 (shown in FIG. 1) and a transistor bank 132 (the transistor bank 132 of the first inverter unit 112-1 is shown in FIG. 2) electrically connected to the input terminal 130. For each of the plurality of inverter units 112, the input terminal 130 may be configured to be connected to the first link 108 for receiving the AC output from the generator 106. Further, the transistor bank 132 of each of the plurality of inverter units 112 may be configured to convert the DC input received from the generator 106 to the DC output for use by the electric motor 116 and other electrical systems and/or devices of the machine.

In some embodiments, the transistor bank 132 of each of the plurality of inverter units 112 may be configured to receive the AC output at a first voltage from the input terminal 130. The transistor bank 132 of each of the plurality of inverter units 112 may also be configured to convert the AC output at the first voltage to the DC output at a second voltage of predefined fixed frequency based on operational demands of the machine. In some embodiments, the predefined fixed frequency may be a standard frequency defined for electrical systems and/or devices of the machine, such as the electric motor 116. It may be contemplated that the predefined frequency and the second voltage of the DC output may also be configured by an operator or a controller of the machine based on the operational demands of machine, to adapt the DC output for use with a wide range of electrical systems and devices of the machine, such as the electric motor 116. In some embodiments, the transistor bank 132 of each of the plurality of inverter units 112 may include one or more power semiconductor devices, such as insulated Gate Bipolar Transistors (IGBT), a thyristor, a power diode or a Metal Oxide Semiconductor Field Effect Transistor (MOSFET).

Figure 3:
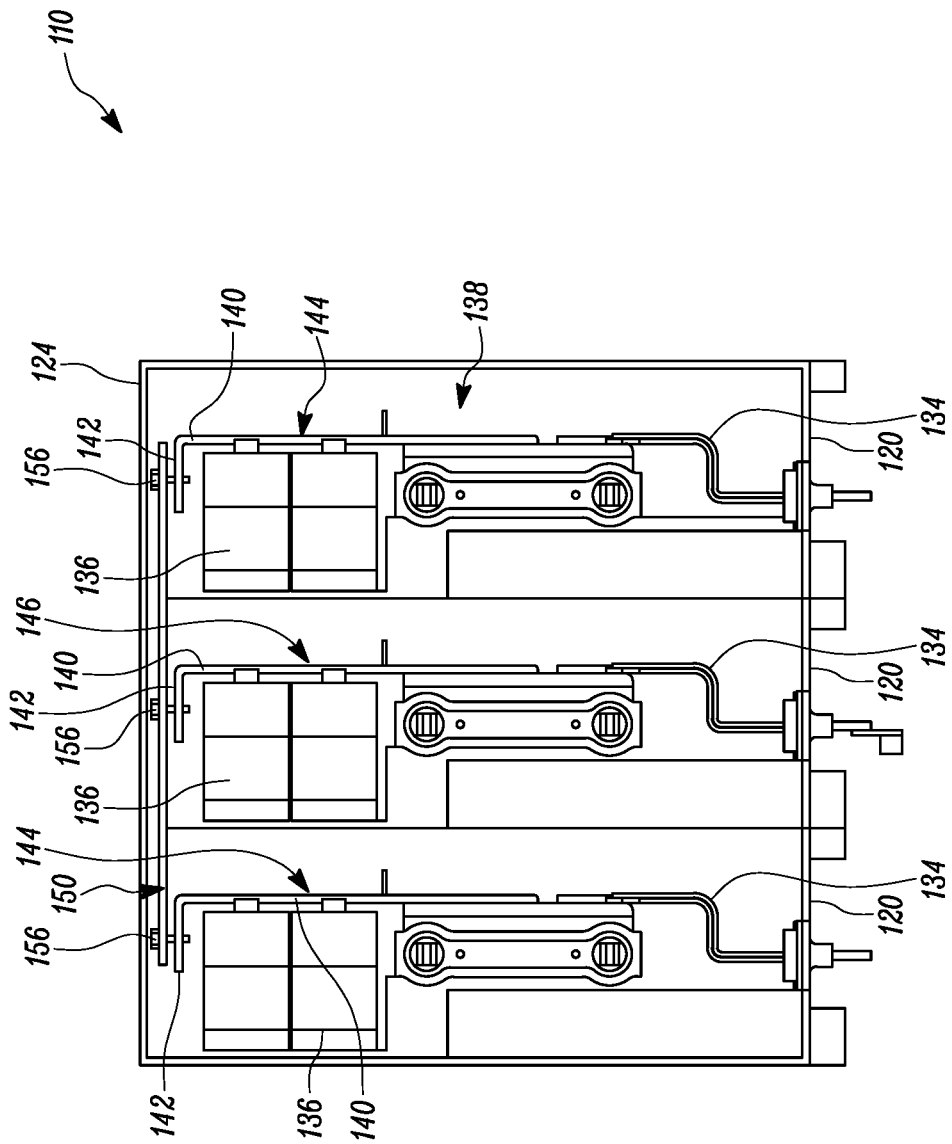
FIG. 3 is a side view of the inverter assembly with one or more components removed, according to an embodiment of the present disclosure.

FIG. 3 is a side view of the inverter assembly 110, according to an embodiment of the present disclosure. The number of components of the inverter assembly 110, as shown in FIG. 3, is provided for explanatory purposes. In practice, there may additional components, fewer components, different components, or differently arranged components than those shown in FIG. 3. Specifically, for clarity purposes, one or more components of the inverter assembly 110, such as the cover members 126 and the pair of side plates 122 of the stackable housing members 118 are not shown in FIG. 3.

Referring to FIGS. 1 and 3, each of the plurality of inverter units 112 may include an output terminal 134 configured to be coupled to the second link 114 for supplying the AC input to the electric motor 116. Although in FIG. 1, the output terminal 134 of each of the plurality of inverter units 112 is shown to be connected to the second link 114 for supplying the DC output to the electric motor 116, it may be contemplated that the output terminal 134 of one inverter unit 112, such as the first inverter unit 112-1, may be connected to the electric motor 116 while the output terminal 134 of the other inverter units, such as the second inverter unit 112-2 and the third inverter unit 112-3, may be connected to other electric systems and/or devices of the machine, without limiting the scope of the present disclosure. Further, as shown in FIG. 3, the output terminal 134 of each of the inverter units 112 may extend outwardly from the base plate 120 of the respective stackable housing member 118, for easy coupling with the second link 114.

Referring now to FIGS. 2 and 3, each of the plurality of inverter units 112 may include at least one filter capacitor 136 connected to the transistor bank 132. For each of the plurality of inverter units 112, each filter capacitor 136 may be configured to reduce ripples in the DC output. Specifically, to meet power quality requirements for the electric motor 116, and other electric devices and/or systems, the filter capacitor 136 may be configured to enhance quality of the DC output by providing high capacitance to the ripple current.

The filter capacitor 136 of each of the plurality of inverter units 112, may include a plurality of auxiliary connectors 138 (shown in FIG. 3) extending outwardly. In some embodiments, each of the plurality of auxiliary connectors 138 may include an elongated portion 140 and a connecting portion 142. The elongated portion 140 may extend vertically from the filter capacitor 136 towards the top plate 124 of the respective stackable housing member 118 and the connecting portion 142 may extend orthogonally from the elongated portion 140.

Further, the plurality of auxiliary connectors 138 may include multiple first auxiliary connectors 144 and multiple second auxiliary connectors 146. In some embodiments, for the filter capacitor 136 of each of the plurality of inverter units 112, the first auxiliary connectors 144 and the second auxiliary connectors 146 may correspond to positive electrical terminals and negative electrical terminals, respectively, of the filter capacitor 136 of respective inverter unit 112.

Referring now to FIG. 3, the inverter assembly 110 may further include a bus bar 150 configured to be connected to the plurality of auxiliary connectors 138 of the filter capacitor 136 of each of the plurality of inverter units 112, to establish electrical connection between the plurality of inverter units 112. Specifically, to establish electrical connection between the plurality of inverter units 112, the bus bar 150 may be configured to connect the first auxiliary connectors 144 of the filter capacitor 136 of each of the first inverter unit 112-1, the second inverter unit 112-2, and the third inverter unit 112-3.

Further, the bus bar 150 may be configured to connect the second auxiliary connectors 146 of the filter capacitor 136 of the first inverter unit 112-1, the second inverter unit 112-2, and the third inverter unit 112-3. In other words, to establish electrical connection among the plurality of inverter units 112, the bus bar 150 may connect the positive terminals of the first inverter unit 112-1, the second inverter unit 112-2 and the third inverter unit 112-3. The bus bar 150 may also connect the negative terminals of the first inverter unit 112-1, the second inverter unit 112-2 and the third inverter unit 112-3.

Figure 4:
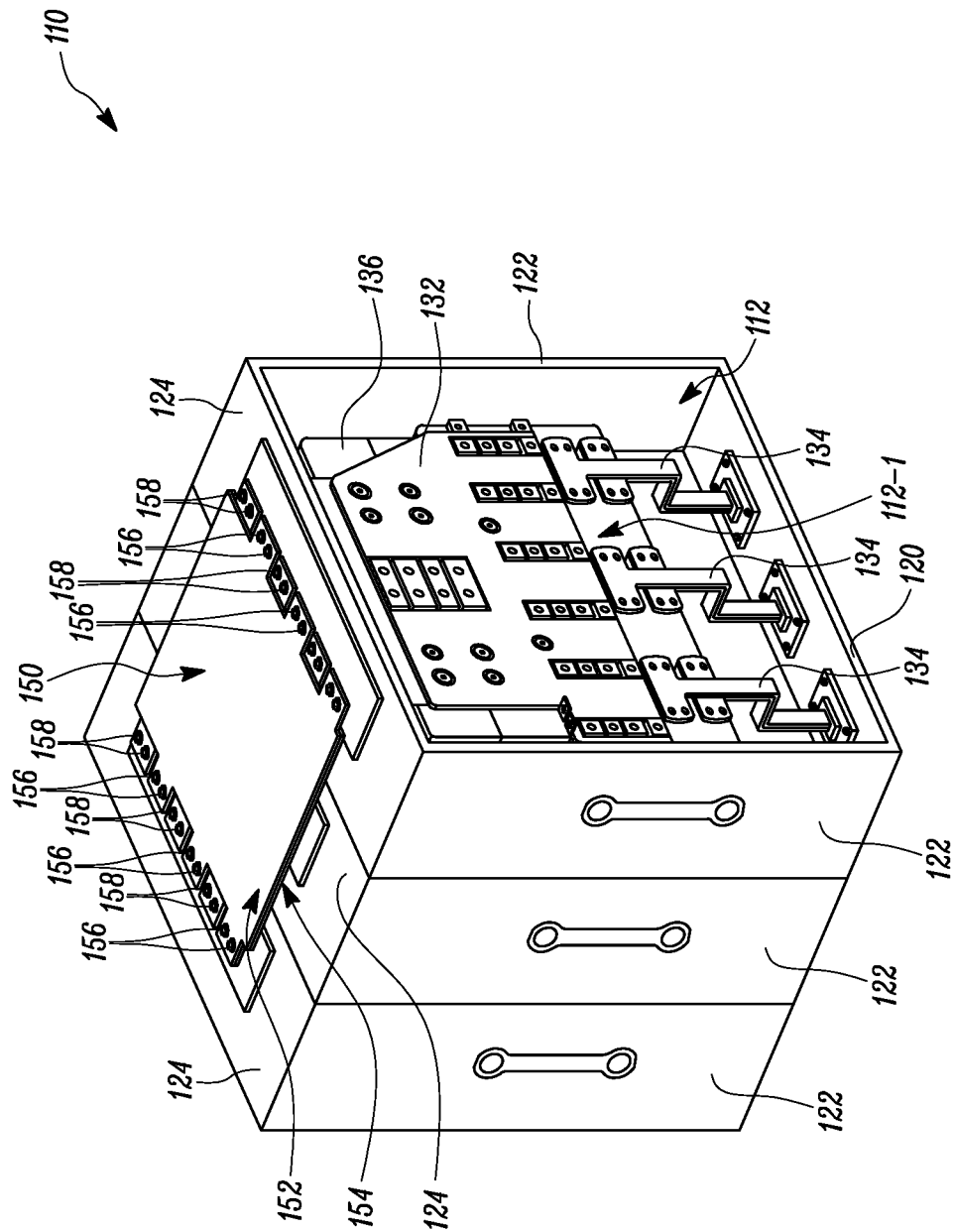
FIG. 4 is a perspective view of the inverter assembly showing a bus bar, according to an embodiment of the present disclosure.

FIG. 4 illustrates a perspective view of the inverter assembly 110 having the bus bar 150, according to an embodiment of the present disclosure. The number of components of the inverter assembly 110, as shown in FIG. 4, is provided for explanatory purposes. In some embodiments, the bus bar 150 may be received through a space defined between the top plate 124 of each of the stackable housing members 118 and the cover members 126. Therefore, to illustrate the bus bar 150, the cover members 126 of the inverter assembly 110 are removed in FIG. 4, for clarity purposes.

Figure 5:
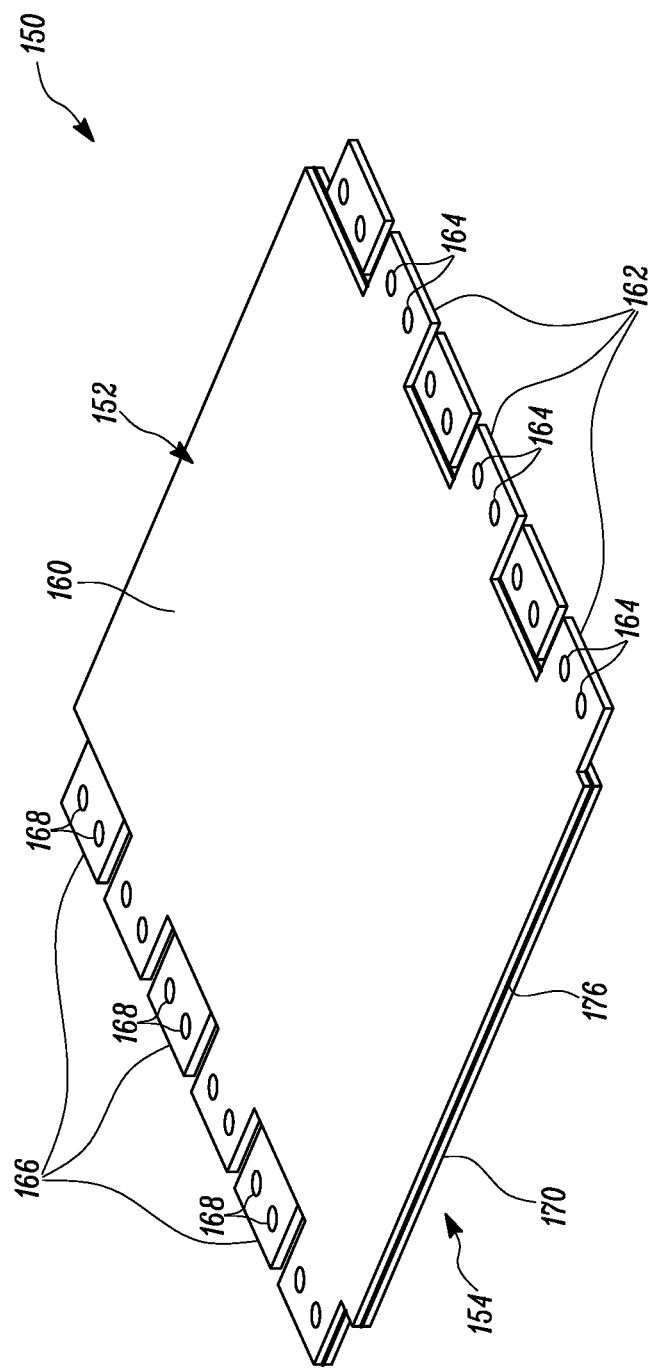
FIG. 5 is a perspective view of the bus bar of the inverter assembly, according to an embodiment of the present disclosure.

As illustrated in FIG. 4 and discussed in more detail with respect to FIG. 5, the bus bar 150 may include a first electrode plate 152 and a second electrode plate 154 electrically insulated from the first electrode plate 152. The first electrode plate 152 may be configured to be coupled to one or more first auxiliary connectors 144 of the plurality of auxiliary connectors 138 of the filter capacitor 136 of each of the plurality of inverter units 112. Further, the second electrode plate 154 may be configured to be coupled to one or more second auxiliary connectors 146 of the plurality of auxiliary connectors 138 of the filter capacitor 136 of each of the plurality of inverter units 112.

In some embodiments, each of the first electrode plate 152 and the second electrode plate 154 may be disposed on the first auxiliary connectors 144 and the second auxiliary connectors 146, respectively, for being coupled to the respective auxiliary connectors 138. In some embodiments, to couple the first electrode plate 152 and the second electrode plate 154 to the respective auxiliary connectors 138, the first electrode plate 152 may be fastened to the first auxiliary connectors 144 using fasteners 156 and the second electrode plate 154 may be fastened to the second auxiliary connectors 146 using fasteners 158. Alternatively, the first electrode plate 152 and the second electrode plate 154 may be coupled to the first auxiliary connectors 144 and the second auxiliary connectors 146, respectively, by various other coupling options, such as welding and soldering.

FIG. 5 illustrates a perspective view of the bus bar 150, according to an embodiment of the present disclosure. In some embodiments, a width of the bus bar 150, as shown, may be greater than a length of the bus bar 150. In some embodiments, each of the first electrode plate 152 and the second electrode plate 154 may be formed in form of an elongated bar made up of the current conducting materials, such as copper, aluminum or alloy thereof. In some embodiments, each of the first electrode plate 152 and the second electrode plate 154 may include copper. Alternatively, each of the first electrode plate 152 and the second electrode plate 154 may include aluminium. Alternatively, the first electrode plate 152 and the second electrode plate 154 may include any material similar to aluminium or copper. In some embodiments, each of the first electrode plate 152 and the second electrode plate 154 may have a predefined thickness and a predefined surface area. One or more of the predefined thickness and the predefined surface area of at least one of the first electrode plate 152 and the second electrode plate 154 may be varied based on operational parameters, type of the filter capacitor 136, and number of inverter units 112. The operational parameters may depend upon application of the inverter assembly 110. In some embodiments, when the application of the bus bar 150 is for a lighting system, the first electrode plate 152 and the second electrode plate 154 may have thickness and surface area different from thickness and surface area of the first electrode plate 152 and the second electrode plate 154 when the application of the bus bar 150 is for an electric drive system of the machine.

Further, in some embodiments, the second electrode plate 154 may be disposed on the first electrode plate 152 and coupled to the first electrode plate 152 through adhesives. To electrically insulate the second electrode plate 154 from the first electrode plate 152, the first electrode plate 152 and the second electrode plate 154 may be laminated through an insulating material layer 176. In an example, the insulating material layer 176 may be Polyethylene Napthalate (PEN).

As shown in FIG. 5, the first electrode plate 152 may include a first elongated body portion 160 and a plurality of first connecting tabs 162 extending from the first elongated body portion 160. In some embodiments, the first elongated body portion 160 may have geometry in the form of a rectangular cuboid, or a volumetric cylinder, for instance. Further, the first connecting tabs 162 may be cuboidal shaped extensions of the first elongated body portions 160. The first connecting tabs 162 may extend from opposing sides and/or middle section of the first elongated body portion 160 and may be sequentially spaced apart from each other to define a gap between two adjacent first connecting tabs 162. In some embodiments, the first electrode plate 152 may include a predefined number of the first connecting tabs 162, for example six first connecting tabs 162. The predefined number of the first connecting tabs 162 may be varied based on various operational parameters, such as an application of the inverter assembly 110 and a type of the filter capacitor 136.

Further, the first connecting tabs 162 may be configured to be coupled to the first auxiliary connectors 144 of the filter capacitor 136. In some embodiments, for coupling the first connecting tabs 162 to the first auxiliary connectors 144, each first connecting tab 162 may include fastener receiving holes 164 for receiving the fasteners 156 that couple the first electrode plate 152 to the first auxiliary connectors 144. Further, in some embodiments, the elongated portion 140 of each first auxiliary connector 144 may extend from the filter capacitor 136 towards the bus bar 150 (see FIG. 3) for being coupled to a first connecting tab 162 of the first connecting tabs 162. In some embodiments, a number of the first connecting tabs 162 may be equal to a number of the first auxiliary connectors 144 such that a first connecting tab 162 of the first connecting tabs 162 is configured to be coupled to the elongated portion 140 of a respective first auxiliary connector 144.

Similar to the first electrode plate 152, the second electrode plate 154 may include a second elongated body portion 170 and a plurality of second connecting tabs 166 extending from the second elongated body portion 170. In some embodiments, the second elongated body portion 170 may have geometry in the form of a rectangular cuboid or a volumetric cylinder, for instance, Further, the second connecting tabs 166 may be extending from opposing sides of the second elongated body portion 170. The second connecting tabs 166 may also be sequentially spaced from each other such that a second connecting tab 166 of the plurality of second connecting tabs 166 is received in the gap defined between two adjacent first connecting tabs 162. The second connecting tab 166 of the plurality of second connecting tabs 166 may be received in the gap, so as to define a clearance between the first connecting tabs 162 and the second connecting tabs 166. In some embodiments, the second electrode plate 154 may include a predefined number of the second connecting tabs 166, for example six second connecting tabs 166. The predefined number of the second connecting tabs 166 may be varied based on various operational parameters, such as an application of the inverter assembly 110, for example in lighting systems, in implement systems, and/or in electric drive systems, and a type of the filter capacitor 136.

The second connecting tabs 166 may be configured to be connected to the second auxiliary connectors 146 of the filter capacitor 136. In some embodiments, each of the second connecting tabs 166 may include fastener receiving holes 168 for receiving the fasteners 158 that couple the second electrode plate 154 to the second auxiliary connectors 146. Further, in some embodiments, the elongated portion 140 of each second auxiliary connector 146 may extend from the filter capacitor 136 towards the bus bar 150 (see FIG. 3) for being coupled to a second connecting tab 166 of the second connecting tabs 166. In an example, a number of the second connecting tabs 166 may be equal to a number of the second auxiliary connectors 146 such that a second connecting tab 166 of the second connecting tabs 166 is configured to be coupled to the elongated portion 140 of a respective second auxiliary connector 146.

Although in the present embodiment, the bus bar 150 includes only one first electrode plate 152 and only one second plate 154, it is understood that the bus bar 150 may also be formed by laminating and/or adhering multiple first electrode plates 152 and multiple second electrode plates 154, where the multiple first electrode plates 152 and the multiple second electrode plates 154 may be individually insulated from the each other.

INDUSTRIAL APPLICABILITY

The present disclosure relates to the inverter assembly 110 and the bus bar 150 of the inverter assembly 110. The plurality of inverter units 112 of the inverter assembly 110 are received within the stackable housing members 118 such that the inverter assembly 110 is advantageously embodied as a single device for providing the AC or DC output to various electric systems and/or devices of the machines, including the electric motor 116. More specifically, the inverter assembly 110 of the present disclosure allows use of multiple of inverter units, such as the plurality of inverter units 112, which can be either distributed or assembled in a stack.

Further, to establish electrical connection between the plurality of inverter units 112, the first electrode plate 152 of the bus bar 150 is connected to the first auxiliary connectors 144 of the filter capacitor 136 of the inverter units 112 and the second electrode plate 154 of the bus bar 150 is connected to the second auxiliary connectors 146 of the filter capacitor 136 of each of the inverter units 112. Because the first electrode plate 152 and the second electrode plate 154 of the bus bar 150, rather than wires, are connected to the filter capacitor 136 of each inverter unit 112, increased surface area to electric current flow among the inverter units 112 is obtained. In addition, due to the first connecting tabs 162 and the second connecting tabs 166 being disposed at minimal distance from each other, a symmetric flow path of the electric current is obtained. As such, an overall impedance of the plurality of inverter units 112 may be substantially reduced due to the increased surface area to electric current flow and symmetric flow path of the electric current. Thus, electric resonance among the plurality of inverter units 112 may be reduced because of the reduced impedance of the plurality of inverter units 112.

Further, referring to accompanying figures, as the bus bar 150 may be disposed on the electrically insulating top plates 124 of the stackable housing members 118, the bus bar 150 may be substantially isolated from other electrical components received within the stackable housing members 118. In some applications, the cover members 126 of the inverter assembly 110 may also seal the bus bar 150 from undesirable environmental elements, such as moisture and chemicals. Therefore, interference and/or noises in the AC or DC output of the inverter assembly 110 are reduced.

Moreover, since provisions for accessing the bus bar 150 through the cover members 126, such as bus bar access holes (not shown) and access bars 172 (shown in FIG. 2), may be provided in the cover members 126, coupling of the bus bar 150 to the auxiliary connectors 138 may be convenient. This may also help in easy detection of faults in the bus bar 150 and the replacement of the bus bar 150, accordingly. Hence, replacement and maintenance costs may be minimized.

Additionally, as the stackable housing members 118 of the inverter assembly 110 may be stacked together as a single structure, the plurality of inverter units 112 may be easily disposed at any location in the machine while efficiently utilizing space in the machine. Thus, the inverter assembly 110 may also be easily disposed in any electrically powered machine which may have space constraints for mounting multiple inverter units. In addition, since one or more of the inverter units 112 may be connected to the electric motor 116 and other inverter units 112 may be connected to other electric systems and/or device, the inverter assembly 110 of the present disclosure may be used to provide the AC or DC output in wide power ranges. This may help in reducing an overall cost and manufacturing time of the machine, as specific locations for mounting the inverter units 112 associated with different electric systems and/or devices of the machine may not be required. Specifically, the inverter assembly 110 of the present disclosure may provide the AC or DC output to wide variety of electric systems and/or devices of the machine that may require power levels in wide power rating range.

While aspects of the present disclosure have been particularly shown and described with reference to the embodiments above, it will be understood by those skilled in the art that various additional embodiments may be contemplated by the modification of the disclosed machines, systems and methods without departing from the spirit and scope of what is disclosed. Such embodiments should be understood to fall within the scope of the present disclosure as determined based upon the claims and any equivalents thereof. As used herein, the articles "a" and "an" are intended to include one or more items, and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. An inverter assembly for a power system, the inverter assembly comprising:
a plurality of stackable housing members, each of the plurality of stackable housing members having a cavity;
a plurality of inverter units, each of the plurality of inverter units received within a corresponding cavity of the plurality of stackable housing members, wherein each of the plurality of inverter units includes an input terminal, an output terminal, and a filter capacitor having a plurality of auxiliary connectors extending outwardly; and a bus bar configured to be connected to the plurality of auxiliary connectors, of the filter capacitor of each of the plurality of inverter units, to establish an electrical connection between the plurality of inverter units.

2. The inverter assembly of claim 1, wherein the bus bar comprises:
   a first electrode plate configured to be coupled to one or more first auxiliary connectors of the plurality of auxiliary connectors of the filter capacitor of each of the plurality of inverter units; and
   a second electrode plate electrically insulated from the first electrode plate, the second electrode plate being configured to be coupled to one or more second auxiliary connectors of the plurality of auxiliary connectors of the filter capacitor of each of the plurality of inverter units.

3. The inverter assembly of claim 2, wherein the first electrode plate and the second electrode plate are laminated through an insulating material.

4. The inverter assembly of claim 2, wherein each of the plurality of auxiliary connectors includes an elongated portion extending from the filter capacitor towards the bus bar.

5. The inverter assembly of claim 4, wherein each of the plurality of auxiliary connectors includes a connecting portion, extending orthogonally from the elongated portion, to be coupled with the first electrode plate and the second electrode plate.

6. The inverter assembly of claim 2, wherein the first electrode plate includes copper.

7. The inverter assembly of claim 2, wherein the second electrode plate includes copper.

8. A power system comprising:
   a power source; and
   an inverter assembly connected to the power source to receive one of an Alternating Current (AC) input and a Direct Current (DC) input, the inverter assembly comprising:
      a plurality of stackable housing members, each of the plurality of stackable housing members having a cavity;
      a plurality of inverter units, each of the plurality of inverter units received within a corresponding cavity of the plurality of stackable housing members, wherein each of the plurality of inverter units includes an input terminal, an output terminal, and a filter capacitor having a plurality of auxiliary connectors extending outwardly; and
      a bus bar configured to be connected to the plurality of auxiliary connectors of each of the plurality of inverter units to establish electrical connection between the plurality of inverter units.

9. The power system of claim 8, wherein the bus bar comprises:
   a first electrode plate configured to be coupled to one or more first auxiliary connectors of the plurality of auxiliary connectors of the filter capacitor of each of the plurality of inverter units; and
   a second electrode plate electrically insulated from the first electrode plate, the second electrode plate being configured to be coupled to one or more second auxiliary connectors of the plurality of auxiliary connectors of the filter capacitor of each of the plurality of inverter units.

10. The power system of claim 9, wherein the first electrode plate and the second electrode plate are laminated through an insulating material.

11. The power system of claim 9, wherein each of the plurality of auxiliary connectors includes an elongated portion extending from the filter capacitor towards the bus bar.

12. The power system of claim 11, wherein each of the plurality of auxiliary connectors a connecting portion extending orthogonally from the elongated portion, to be coupled with the first electrode plate and the second electrode plate.

13. The power system of claim 9, wherein the first electrode plate includes copper.

14. The power system of claim 9, wherein the second electrode plate includes copper.

15. A bus bar for electrically coupling a plurality of inverter units of an inverter assembly, the bus bar comprising:
   a first electrode plate configured to be coupled to one or more first auxiliary connectors of a plurality of auxiliary connectors of a filter capacitor of each of the plurality of inverter units; and
   a second electrode plate electrically insulated from the first electrode plate, the second electrode plate being configured to be coupled to one or more second auxiliary connectors of the plurality of auxiliary connectors of the filter capacitor of each of the plurality of inverter units,
   wherein each of the plurality of auxiliary connectors includes an elongated portion extending from the filter capacitor towards the bus bar and a connecting portion extending orthogonally from the elongated portion to couple with the first electrode plate and the second electrode plate.

16. The bus bar of claim 15, wherein a width of the bus bar is greater than a length of the bus bar.

17. The bus bar of claim 15, wherein the first electrode plate and the second electrode plate are laminated through an insulating material.

18. The bus bar of claim 15, wherein the first electrode plate includes copper.

19. The bus bar of claim 15, wherein the second electrode plate includes copper.

20. An inverter assembly for a power system, the inverter assembly comprising:
   a plurality of stackable housing members, each of the plurality of stackable housing members having a cavity;
   a plurality of inverter units, each of the plurality of inverter units received within a corresponding cavity of the plurality of stackable housing members, wherein each of the plurality of inverter units includes a filter capacitor having a plurality of auxiliary connectors extending outwardly; and
   a bus bar configured to be connected to the plurality of auxiliary connectors, of the filter capacitor of each of the plurality of inverter units, to establish an electrical connection between the plurality of inverter units;
   wherein the plurality of stackable housing members includes a first stackable housing member and a second stackable housing member, and wherein a plurality of first connecting blocks are associated with the first stackable housing member and a plurality of second connecting blocks are associated with the second stackable housing member, and wherein the first stackable housing member is attached to the second stackable housing member by aligning and attaching each of the plurality of first connecting blocks with a respective second connecting blocks.

* * * * *